(12) United States Patent
Kon

(10) Patent No.: US 11,361,946 B2
(45) Date of Patent: Jun. 14, 2022

(54) SUBSTRATE PROCESSING APPARATUS

(71) Applicant: TOKYO ELECTRON LIMITED, Tokyo (JP)

(72) Inventor: Masato Kon, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 126 days.

(21) Appl. No.: 16/698,279

(22) Filed: Nov. 27, 2019

(65) Prior Publication Data

US 2020/0176229 A1    Jun. 4, 2020

(30) Foreign Application Priority Data

Nov. 29, 2018    (JP) .............................. JP2018-223920

(51) Int. Cl.
*H01J 37/32* (2006.01)
*H01L 21/67* (2006.01)
*H01L 21/683* (2006.01)

(52) U.S. Cl.
CPC .. *H01J 37/32642* (2013.01); *H01J 37/32807* (2013.01); *H01J 37/32816* (2013.01); *H01L 21/67069* (2013.01); *H01J 37/32715* (2013.01); *H01J 2237/334* (2013.01); *H01L 21/6833* (2013.01)

(58) Field of Classification Search
None
See application file for complete search history.

(56) References Cited

U.S. PATENT DOCUMENTS

| | | | |
|---|---|---|---|
| 2004/0014319 A1* | 1/2004 | Sahota | C09G 1/02 438/692 |
| 2012/0061351 A1* | 3/2012 | Ohata | H01J 37/32091 216/67 |
| 2014/0335698 A1* | 11/2014 | Singh | H01L 21/3065 438/758 |
| 2017/0032987 A1* | 2/2017 | Lee | H01L 21/68735 |
| 2017/0110295 A1* | 4/2017 | Hwang | H01J 37/32697 |
| 2017/0225288 A1* | 8/2017 | Omagari | B24B 37/20 |
| 2019/0051489 A1* | 2/2019 | Nakano | H01J 37/20 |

FOREIGN PATENT DOCUMENTS

JP    2008-244274 A    10/2008

\* cited by examiner

*Primary Examiner* — Ram N Kackar
(74) *Attorney, Agent, or Firm* — Weihrouch IP

(57) ABSTRACT

In a substrate processing apparatus, a processing chamber, in which a target substrate is disposed and substrate processing is performed on the target substrate, is provided. A consumable part is disposed in the processing chamber and consumed by the substrate processing. A supply unit is configured to supply an ionic liquid in response to a consumption of the consumable part. A drive unit is configured to drive the consumable part by using the ionic liquid supplied from the supply unit.

10 Claims, 6 Drawing Sheets

SUBSTRATE PROCESSING APPARATUS

CROSS-REFERENCE TO RELATED APPLICATIONS

This application claims priority to Japanese Patent Application No. 2018-223920, filed on Nov. 29, 2018, the entire contents of which are incorporated herein by reference.

TECHNICAL FIELD

The present disclosure relates to a substrate processing apparatus.

BACKGROUND

Japanese Patent Application Publication No. 2008-244274 discloses a technique in which an annular peripheral dielectric member having an electrostatic capacitance per unit area larger than that of a dielectric member disposed at a lower part of an electrostatic chuck is disposed under a focus ring to make it relatively difficult for high frequencies to pass through the peripheral dielectric and the focus ring.

SUMMARY

The present disclosure provides a technique capable of driving a consumable part with a simple configuration.

In accordance with an aspect of the present disclosure, there is provided a substrate processing apparatus including: a processing chamber in which a target substrate is disposed and substrate processing is performed on the target substrate; a consumable part disposed in the processing chamber and consumed by the substrate processing; a supply unit configured to supply an ionic liquid in response to a consumption of the consumable part; and a drive unit configured to drive the consumable part by using the ionic liquid supplied from the supply unit.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a substrate processing apparatus of the present disclosure will be described in detail with reference to the accompanying drawings. The substrate processing apparatus disclosed herein is not limited by the following embodiments.

There is known a plasma processing apparatus that performs an etching process using plasma on a semiconductor wafer (hereinafter, referred to as "wafer"). In the plasma processing apparatus, parts in a processing chamber are consumed due to the influence of plasma, etching gas, and by-products as the process proceeds. For example, in a plasma processing apparatus, a part made of silicon such as a focus ring may be installed to surround the wafer. This silicon part becomes thinner and the surface morphology thereof is changed by the etching process. Some other parts, when consumed, cause the volume of the processing chamber to be relatively large and the change of the positional relationship with the electrodes, so that the influence on the etching process increases. Therefore, those parts such as the focus ring and the like that become thinner due to the consumption are formed to have a relatively larger thickness in anticipation of the decrease in thickness, thereby forming a cutting margin portion thereon.

Further, depending on the consumption of the parts, it may be possible to adjust the positions of the parts by driving the parts with an electric drive mechanism such as a motor. However, when the substrate processing apparatus is provided with the electric drive mechanism such as the motor, the apparatus configuration becomes complicated. Therefore, it is desirable to provide a technique that can drive the consumable parts with a simple configuration.

<Configuration of the Substrate Processing Apparatus>

Figure 1:
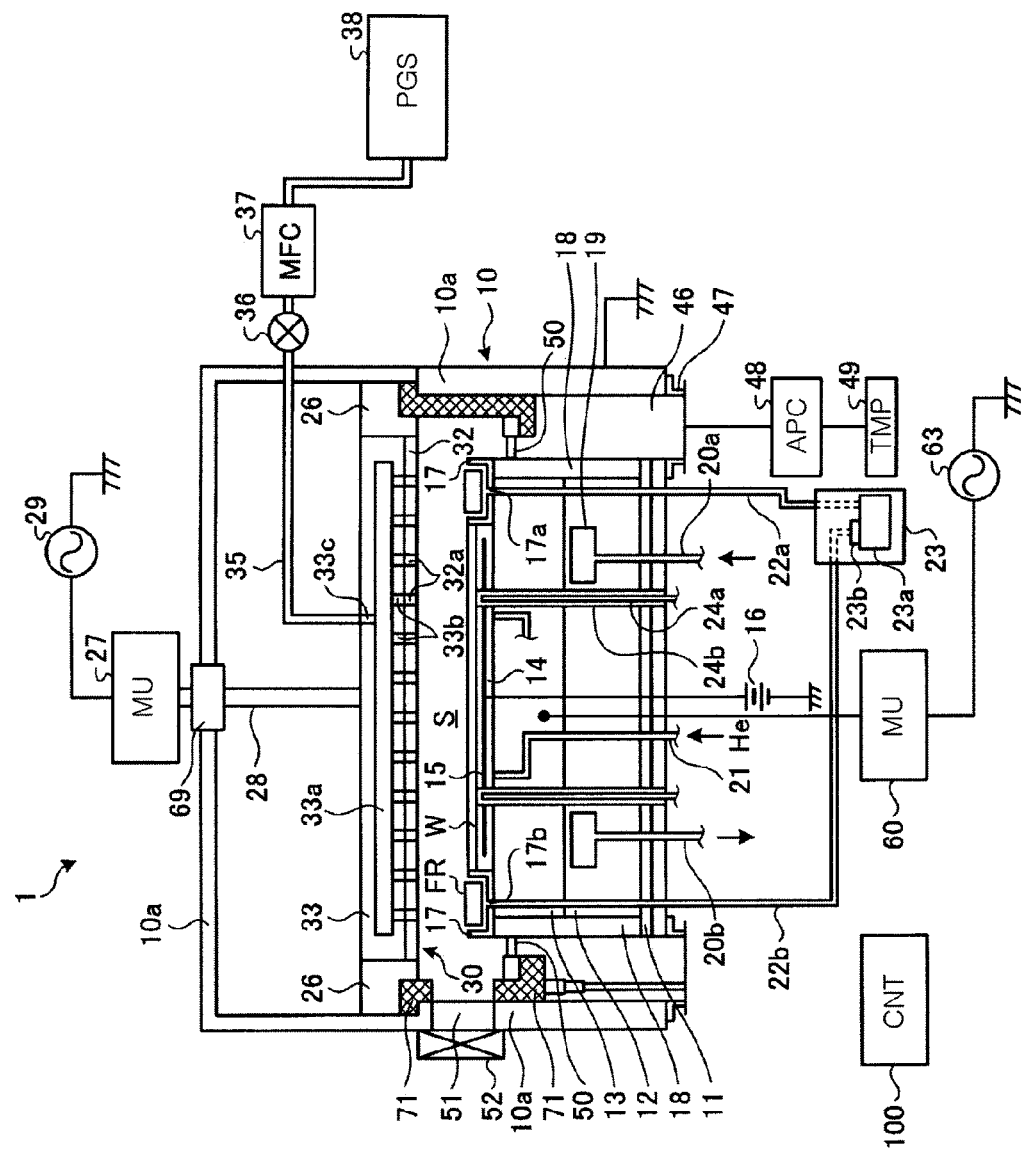
FIG. 1 is a cross-sectional view showing a schematic configuration of a substrate processing apparatus according to an embodiment.

Next, an example of a configuration of a substrate processing apparatus according to the present embodiment will be described. FIG. 1 is a cross-sectional view showing a schematic configuration of the substrate processing apparatus according to the embodiment. In the present embodiment, the case where the substrate processing apparatus is a plasma processing apparatus 1 that performs plasma etching on a semiconductor wafer W that is a substrate to be processed is described as an example. However, the substrate processing apparatus is not particularly limited to the plasma processing apparatus 1.

The plasma processing apparatus 1 is configured as a capacitively-coupled parallel-plate plasma etching apparatus. The plasma processing apparatus 1 includes a cylindrical processing chamber 10 made of, e.g., aluminum having an alumite-treated surface (anodically oxidized surface). The processing chamber 10 is frame grounded. Further, the plasma processing apparatus 1 is not limited to the capacitively-coupled parallel-plate plasma etching apparatus, and may be any type of plasma processing apparatus such as an inductively-coupled plasma (ICP) processing apparatus, a microwave plasma processing apparatus, a magnetron plasma processing apparatus or the like.

A cylindrical susceptor supporting table 12 is disposed through an insulating plate 11 made of, e.g., ceramic on a bottom portion of the processing chamber. A susceptor 13 is disposed on the susceptor supporting table 12. The susceptor 13 is made of a conductive member such as aluminum and serves as a lower electrode. For example, a semiconductor wafer W is placed on the susceptor 13 as a substrate to be processed.

An electrostatic chuck 14 for attracting and holding the semiconductor wafer W by an electrostatic attraction force is disposed on an upper surface of the susceptor 13. The electrostatic chuck 14 has a configuration such that a sheet-shaped electrode plate 15 made of a conductive film is disposed between dielectric layers made of a pair of dielectric members. A DC power supply 16 is electrically connected to the electrode plate 15 through a connection terminal. The semiconductor wafer W is attracted to and held on the electrostatic chuck 14 by a Coulomb force or a Johnson-Rahbeck force generated by applying a DC voltage from the DC power supply 16.

Further, the susceptor 13 and the electrostatic chuck 14 are formed with a through-hole 24b, through which a pusher pin 24a for raising and lowering the semiconductor wafer W is moved up and down, in a portion that attracts and holds the semiconductor wafer W. The pusher pin 24a is connected to a motor (not shown) via a ball screw (not shown) and protrudes beyond an upper surface of the electrostatic chuck 14 by the rotational motion of the motor converted into a linear motion by the ball screw. Therefore, the pusher pin 24a protrudes and retracts by moving up and down in an inner space while penetrating the electrostatic chuck 14 and the susceptor 13. When the semiconductor wafer W is loaded into and unloaded from the processing chamber 10, the pusher pin 24a protrudes beyond the electrostatic chuck 14 to lift upward the semiconductor wafer W away from the electrostatic chuck 14. When an etching process is performed on the semiconductor wafer W, the pusher pin 24a is accommodated in the electrostatic chuck 14.

Figure 2:
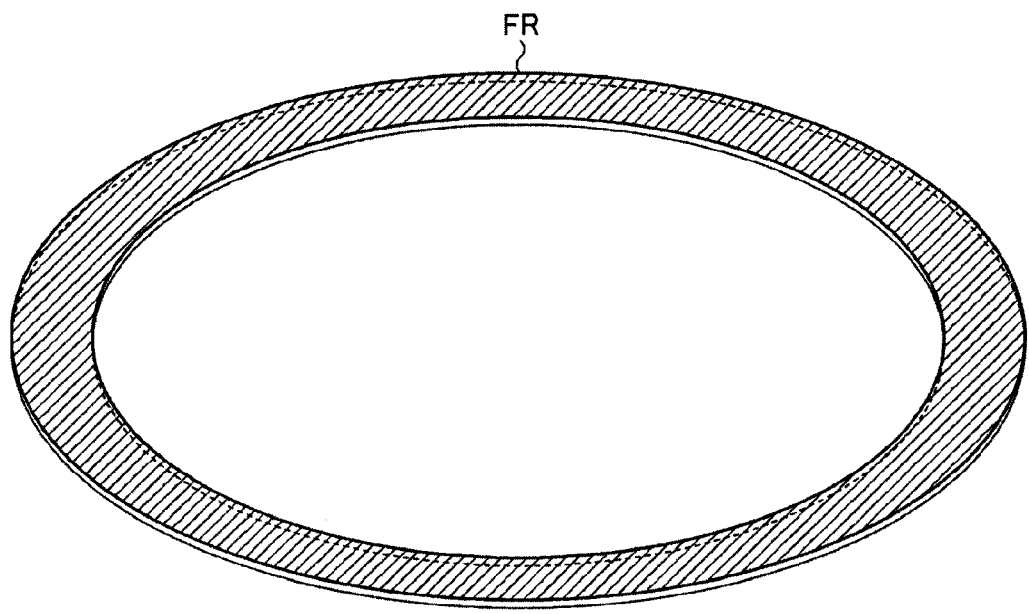
FIG. 2 is a perspective view showing an example of a schematic shape of a focus ring according to the embodiment.

A focus ring FR made of, e.g., silicon (Si) is disposed on an upper peripheral surface of the susceptor 13 to improve the etching uniformity. FIG. 2 is a perspective view showing an example of a schematic shape of the focus ring FR according to the embodiment. The focus ring FR has an inner diameter slightly larger than the diameter of the semiconductor wafer W. The focus ring FR is formed in a flat and annular shape. The focus ring FR is consumed by etching from an upper surface side exposed to the plasma. The focus ring FR is formed to have a relatively larger thickness in anticipation of the decrease in thickness due to the consumption by the etching, thereby forming a cutting margin portion thereon.

Figure 3:
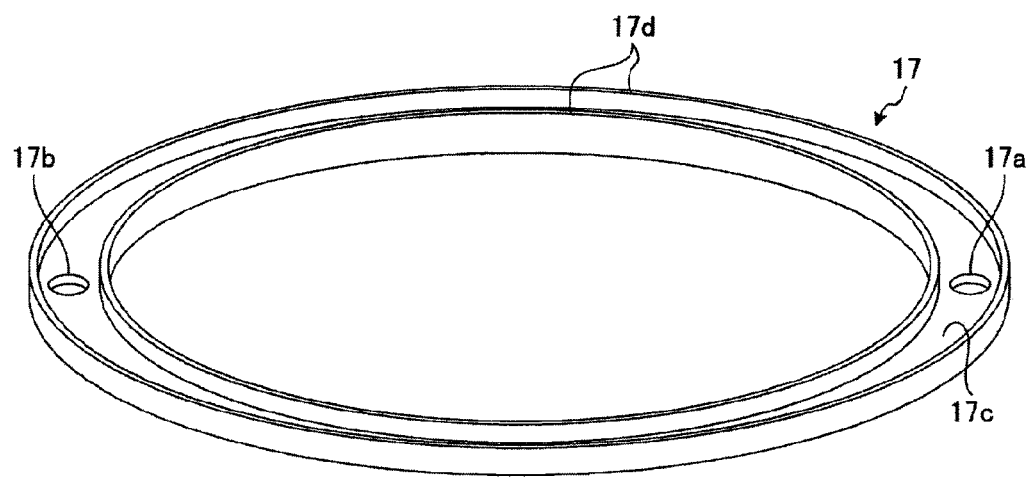
FIG. 3 is a perspective view showing an example of a schematic shape of a container according to the embodiment.

Referring back to FIG. 1, the susceptor 13 is provided with a drive unit for driving the focus ring FR. In the present embodiment, a container 17 is provided on the upper peripheral surface of the susceptor 13 as the drive unit. FIG. 3 is a perspective view showing an example of a schematic shape of the container according to the embodiment. The container 17 has an annular shape and has a bottom portion 17c and a side wall 17d. Further, an upper portion of the container 17 is opened, and an ionic liquid can be held in an inner space surrounded by the bottom portion 17c and the side wall 17d. The container 17 has a supply port 17a through which the ionic liquid is supplied and a discharge port 17b through which the ionic liquid is discharged at the bottom portion 17c.

Referring back to FIG. 1, the plasma processing apparatus 1 includes a mechanism for supplying and retrieving the ionic liquid with respect to the container 17.

In the present embodiment, a pipe 22a is connected to the supply port 17a of the container 17, and a pipe 22b is connected to the discharge port 17b of the container 17.

Further, the pipes 22a and 22b are connected to a supply unit 23. A known liquid transport system or the like can be used as the supply unit 23. The supply unit 23 includes a tank 23a for storing the ionic liquid and supplies the ionic liquid in the tank 23a to the pipe 22a. The ionic liquid supplied to the pipe 22a is supplied to the container 17 from the supply port 17a. Further, the ionic liquid of the container 17 returns to the supply unit 23 through the pipe 22b from the discharge port 17b and is stored in the tank 23a. That is, the ionic liquid is circulated between the container 17 and the supply unit 23 through the pipes 22a and 22b. The supply unit 23 further includes a filter 23b for filtering the ionic liquid in the circulation path of the ionic liquid.

In the present embodiment, the supply port 17a and the discharge port 17b of the container 17 are provided so that the ionic liquid can be supplied and discharged through the pipes 22a and 22b to circulate the ionic liquid. However, the present disclosure is not limited thereto. For example, only the supply port 17a may be provided in the container 17, and the supply unit 23 may supply and discharge the ionic liquid from the supply port 17a through the pipe 22a at different timings.

Further, in the present embodiment, the supply unit 23 is arranged outside the processing chamber 10, and the ionic liquid is circulated between the container 17 provided in the processing chamber 10 and the supply unit 23 through the pipes 22a and 22b. However, the present disclosure is not limited thereto, and the supply unit 23 may be disposed inside the processing chamber 10.

Figure 4:
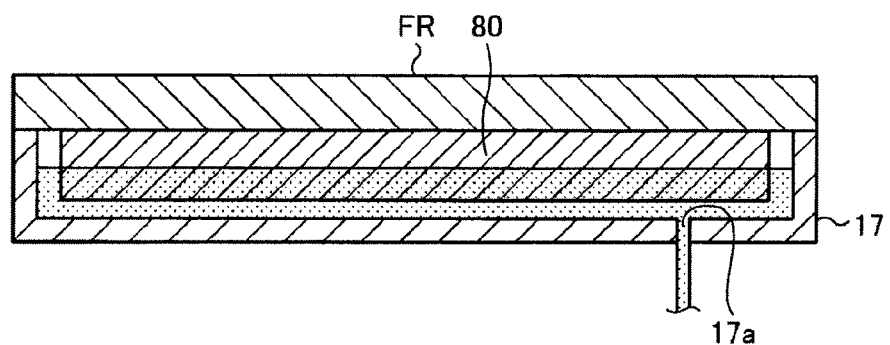
FIG. 4 is a cross-sectional view showing an example of a state in which the focus ring according to the embodiment is floated on an ionic liquid in a container.

The container 17 stores the ionic liquid supplied from the supply unit 23, and the focus ring FR is floated and held on the stored ionic liquid. FIG. 4 is a cross-sectional view showing an example of a state in which the focus ring according to the embodiment is floated on the ionic liquid in the container 17. The focus ring FR floats on the ionic liquid stored in the container 17. In order to effectively transfer buoyancy force or pressure exerted by the ionic liquid to the focus ring FR, a support base 80 may be provided on a lower side of the focus ring FR. In the example of FIG. 4, the support base 80 is disposed on a lower surface of the focus ring FR. For example, when the specific gravity of the focus ring FR is heavier than the specific gravity of the ionic liquid, the support base 80 having a lighter specific gravity than the ionic liquid is attached on the lower surface of the focus ring FR. This allows the total specific gravity of the focus ring FR and the support base 80 to be lighter than the specific gravity of the ionic liquid. Therefore, the focus ring FR can be floated on the ionic liquid.

Referring back to FIG. 1, side surfaces of the susceptor 13 and the susceptor support table 12 are surrounded by a cylindrical member 18 made of, e.g., quartz ($SiO_2$). A coolant chamber 19 extending in, e.g., a circumferential direction of the susceptor support table 12 is provided in the susceptor support table 12. A coolant having a predetermined temperature such as cooling water is supplied from an external chiller unit (not shown) to the coolant chamber 19 through pipes 20a and 20b to be circulated in the coolant chamber 19. A processing temperature of the semiconductor wafer W on the susceptor 13 is controlled by the temperature of the coolant circulated in the coolant chamber 19.

Further, the susceptor 13 and the electrostatic chuck 14 are provided with a gas supply line 21. A heat transfer gas such as helium (He) gas is supplied to the gas supply line 21 from a heat transfer gas supply mechanism (not shown). By supplying the heat transfer gas to a gap between an upper surface of the electrostatic chuck 14 and a lower surface of the semiconductor wafer W through the gas supply line 21, the heat transfer between the semiconductor wafer W and the susceptor 13 is efficiently and uniformly controlled.

An upper electrode 30 is disposed above the susceptor 13 so as to be opposite to the susceptor 13. A space formed between the susceptor 13 and the upper electrode 30 serves as a plasma generation space S. An annular insulating shielding member 26 made of, e.g., alumina ($Al_2O_3$) or yttrium oxide ($Y_2O_3$) is airtightly disposed between the upper electrode 30 and a sidewall of the processing chamber 10.

The upper electrode 30 is preferably made of, e.g., a semiconductor such as silicon or a low-resistance conductor with low Joule heat. An upper high frequency power supply 29 is electrically connected to the upper electrode 30 through an upper power feed rod 28 and an upper matching unit (MU) 27. The upper high frequency power supply 29 outputs a high-frequency voltage having a predetermined frequency of 13.5 MHz or more for plasma generation. For example, the upper high frequency power supply 29 outputs a high-frequency voltage of 60 MHz. The upper matching unit 27 is arranged to match the load impedance with the internal impedance of the upper high frequency power supply 29, and serves to render the output impedance of the upper high frequency power supply 29 and the load impedance to be seemingly matched to each other when plasma is generated in the processing chamber 10.

The sidewall of the processing chamber 10 extends upward above the height level of the upper electrode 30 and forms a cylindrical grounded conductive body 10a. The top of the cylindrical grounded conductive body 10a is electrically insulated from the upper power feed rod 28 by a tube-like insulating member 69.

The upper electrode 30 is held at an upper portion of the processing chamber 10 through an insulating shielding member 26. The upper electrode 30 includes an upper electrode plate 32 and an electrode holder 33. The upper electrode plate 32 faces the plasma generation space S and has a plurality of gas injection holes 32a. The upper electrode plate 32 is made of, e.g., a semiconductor such as silicon or silicon carbide (SiC) or a low-resistance conductor with low Joule heat. The upper electrode 30 is configured such that the temperature of the upper electrode 30 can be controlled. For example, the upper electrode 30 includes a temperature control mechanism such as a heater (not shown) to perform the temperature control thereof.

The electrode holder 33 detachably holds the upper electrode plate 32. The electrode holder 33 is made of, e.g., a conductive material such as aluminum having an alumite-treated surface. The electrode holder 33 has therein a gas diffusion space 33a, for example. In the electrode holder 33, a plurality of gas holes 33b communicating with the gas injection holes 32a extends downward from the gas diffusion space 33a. Further, the electrode holder 33 has a gas inlet 33c for introducing a processing gas into the gas diffusion space 33a. A gas supply line 35 is connected to the gas inlet 33c.

A processing gas supply source (PGS) 38 is connected to the gas supply line 35 via an opening/closing valve 36 and a mass flow controller (MFC) 37. The processing gas supply source 38 includes gas sources for various processing gases used for the plasma processing and supplies various gases based on the plasma processing. The processing gas supplied from the processing gas supply source 38 reaches the gas diffusion space 33a through the gas supply line 35 and is injected to the plasma generation space S through the gas holes 33b and the gas injection holes 32a.

A gas exhaust port 46 is formed at a bottom portion of the processing chamber 10. The gas exhaust port 46 is connected to an automatic pressure control valve (hereinafter referred to as "APC valve") (APC) 48 and a turbo molecular pump (hereinafter referred to as "TMP") (TMP) 49 through a gas exhaust manifold 47. The APC valve 48 cooperates with the TMP 49 to depressurize the plasma generation space S in the processing chamber 10 to a predetermined depressurized state. An annular baffle plate 50 having a plurality of through-holes is disposed between the gas exhaust port 46 and the plasma generation space S so as to surround the susceptor 13. The baffle plate 50 is configured to suppress plasma leakage from the plasma generation space S to the gas exhaust port 46.

Further, a loading/unloading port 51 for loading and unloading the semiconductor wafer W and a gate valve 52 for opening and closing the loading/unloading port 51 are disposed at the outside of the sidewall of the processing chamber 10. Further, inside of the processing chamber 10, a substantially cylindrical deposition shield 71 is provided to extend along the inner wall of the processing chamber 10.

The semiconductor wafer W is loaded and unloaded by opening and closing the gate valve 52. Since the gate valve 52 is disposed outside the processing chamber 10, a space in which the loading/unloading port 51 protrudes toward the atmosphere side is formed.

In the plasma processing apparatus 1, a lower high frequency power supply 63 is electrically connected to a susceptor 13 serving as a lower electrode through a lower matching unit (MU) 60. The lower high frequency power supply 63 outputs a high-frequency voltage having a predetermined frequency within a range from 2 MHz to 27 MHz for bias application for plasma attraction. For example, the lower high frequency power supply 63 outputs a high frequency voltage having a frequency of 2 MHz. Alternatively, the plasma processing apparatus 1 may be configured as a lower side dual frequency plasma apparatus that applies a high-frequency voltage having a predetermined frequency for plasma generation to the susceptor 13. The lower matching unit 60 is arranged to match the load impedance with the internal impedance of the lower high frequency power supply 63, and serves to render the internal impedance of the lower high frequency power supply 63 and the load impedance to be seemingly matched to each other when plasma is generated in the plasma generation space S in the processing chamber 10.

The plasma processing apparatus 1 includes a controller (CNT) 100 that controls the operations of the respective components of the plasma processing apparatus 1. For example, the controller 100 controls the operation of the component such as the supply unit 23.

The controller 100 is, e.g., a computer having a central processing unit (CPU), random access memory (RAM), read only memory (ROM), an auxiliary storage device, and the like. The CPU operates based on a process condition of plasma processing or a program stored in the ROM or the auxiliary storage device and controls the operation of the entire apparatus. Further, the controller 100 may be provided inside or outside of the plasma processing apparatus 1. When the controller 100 is provided outside of the plasma processing apparatus 1, the controller 100 can control the plasma processing apparatus 1 through, e.g., wireless communication or wired communication.

Next, a flow of the etching process performed by the plasma processing apparatus 1 according to the embodiment will be briefly described.

In the plasma processing apparatus 1, the gate valve 52 is opened. A semiconductor wafer W that is a target object is loaded into the processing chamber 10 through the loading/unloading port 51 by a transfer device (not shown) and placed on the susceptor 13. The gate valve 52 is closed after the transfer device is retracted.

In the plasma processing apparatus 1, the processing chamber 10 is maintained in a vacuum atmosphere during the etching process. For example, by operating the TMP 49, the inside of the processing chamber 10 is depressurized to a predetermined depressurized pressure level. Further, a DC voltage is applied from the DC power supply 16 to the electrode plate 15 of the electrostatic chuck 14 to electrostatically attract and hold the semiconductor wafer W to the susceptor 13.

In the plasma processing apparatus 1, a processing gas used for the etching process is introduced from the processing gas supply source 38 into the processing chamber 10 at a predetermined flow rate and flow rate ratio. Further, the high frequency power of, e.g., 60 MHz for plasma generation is applied at a predetermined power level to the upper electrode 30 from the upper high frequency power supply 29. Further, a high frequency power of, e.g., 2 MHz for bias is applied at a predetermined power level to the lower electrode that is the susceptor 13. As a result, plasma is generated in the plasma generation space S between the upper electrode 30 and the susceptor 13. Ions in the plasma are attracted to the semiconductor wafer W by the high frequency power from the lower high frequency power supply 63. Accordingly, the semiconductor wafer W is etched.

However, in the plasma processing apparatus 1, as the etching process is performed, the parts in the processing chamber 10 are consumed due to the influence of plasma, etching gas, and by-products. For example, the focus ring FR becomes thinner according to the number of times that the etching process has been performed. When the thickness of the focus ring FR is reduced, the height of the plasma sheath above the focus ring FR becomes different from the height of the plasma sheath above the semiconductor wafer W, which leads to the change in etching characteristics.

Therefore, in the plasma processing apparatus 1 according to the embodiment, the supply unit 23 is controlled in response to (following) the consumption of the focus ring FR, and the focus ring FR is driven by the ionic liquid. For example, since the controller 100 raises the focus ring FR by an amount corresponding to the consumption amount of the focus ring FR for each execution of the etching process, the supply amount of the ionic liquid required for raising the focus ring FR for each execution of the etching process is stored in the auxiliary storage device. Then, the controller 100 reads the supply amount of the ionic liquid according to the number of times the etching process is run from the auxiliary storage device, and controls the supply unit 23 to supply the ionic liquid having the supply amount according to the number of times the etching process is run to the container 17. As a result, in the plasma processing apparatus 1, the amount of the ionic liquid stored in the container 17 increases, and the focus ring FR is raised due to the buoyancy force exerted by the ionic liquid.

Figure 5:
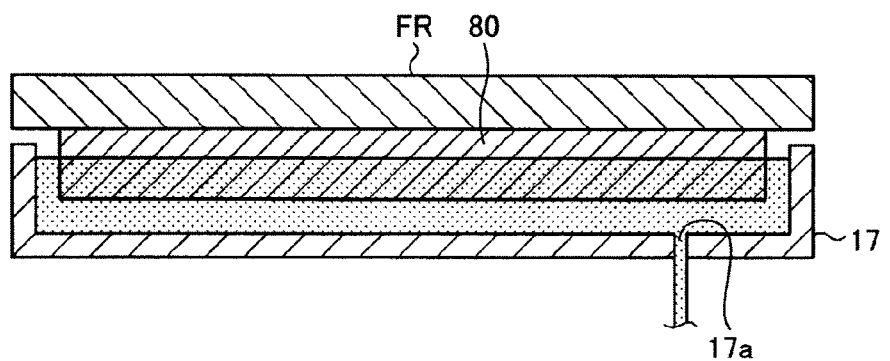
FIG. 5 is a cross-sectional view showing an example of a state in which the focus ring according to the embodiment is raised.

FIG. 5 is a cross-sectional view showing an example of a state in which the focus ring according to the embodiment is raised. In FIG. 5, the amount of the ionic liquid stored in the container 17 is increased as compared with the amount of the ionic liquid shown in FIG. 4, and the focus ring FR floating on the ionic liquid is raised. As a result, the height difference between the height of the plasma sheath above the focus ring FR and the height of the plasma sheath above the semiconductor wafer W can be reduced so that the changes in etching characteristics can be suppressed even when the focus ring FR is consumed.

Accordingly, it is not necessary for the plasma processing apparatus 1 to include an electric drive mechanism such as a motor in order to drive the focus ring FR, and the focus ring FR can be driven with a simple configuration by supplying the ionic liquid. In addition, when the electric drive mechanism such as the motor is provided, there is a risk of dust generation from the electric drive mechanism. However, it is not necessary to provide such a drive mechanism in the plasma processing apparatus 1, and the risk of dust generation can be suppressed by driving the focus ring FR with the ionic liquid.

<Example of an Ionic Liquid>

An ionic liquid is a general term for a salt that is composed of only ions and is liquid at room temperature. The ionic liquid has the advantage of having characteristics such as negligible vapor pressure, non-volatility (not volatile even at high temperatures or in a vacuum atmosphere), high ionic conductivity, high thermal conductivity, excellent thermal stability and non-flammability. In addition, the ionic liquid can be either hydrophilic or hydrophobic and have a high polarity. Since the ionic liquid is liquid, it can be supplied into the processing chamber 10 through the pipes 22a and 22b.

Further, since the ionic liquid has the advantage of being non-volatile even in a vacuum atmosphere, the ionic liquid can be kept as liquid in the vacuum atmosphere in the processing chamber 10. As a result, the plasma processing apparatus 1 does not have an effect of causing volatile components and decomposition products of the ionic liquid to adhere to the semiconductor wafer W transferred in the processing chamber 10. In addition, ionic liquids having properties of hydrophobicity, insolubility in water and being unreactive with water (moisture) are used as the ionic liquid.

Since the ionic liquid having properties of hydrophobicity, insolubility in water, and being unreactive with water is used, it is possible to prevent the moisture from being absorbed into the ionic liquid. If the moisture is absorbed into the ionic liquid, the moisture in the ionic liquid is released into a vacuum atmosphere when the inside of the processing chamber 10 is vacuum evacuated. This affects the degree of vacuum in the processing chamber 10. Therefore, it is preferred that the ionic liquid is hydrophobic, water-insoluble and does not react with water. Accordingly, the deterioration of the vacuum degree in the processing chamber 10 can be suppressed.

Further, it is preferred that the ionic liquid is a liquid with a temperature in the range from room temperature to the temperature during plasma processing. In order to appropriately secure the optimum range (process window) of the production conditions, an ionic liquid having a melting point as low as possible is preferred, and an ionic liquid having a boiling point as high as possible is preferred.

As examples of appropriate ionic liquids, at least one of methyltrioctylammonium thiosalicylate, trihexyl(tetradecyl) phosphonium bis(2-ethylhexyl) phosphate, methyl-trioctylammonium bis (trifluoromethylsulfonyl) imide, 1-Ethyl-3-methylimidazolium bis(trifluoromethylsulfonyl) imide, 1-Butyl-3-methylimidazolium bis(trifluoromethylsulfonyl) imide, 1-Hexyl-3-methylimidazolium bis(trifluoromethylsulfonyl) imide, or 1-Methyl-1-propylpyrrolidinium bis(trifluoromethylsulfonyl) amide is used.

In the plasma processing apparatus 1 according to the embodiment, the ionic liquid described above is stored in the container 17 and the focus ring FR is raised by using buoyancy force exerted by the ionic liquid.

Further, the plasma processing apparatus 1 is configured to supply the ionic liquid from the supply unit 23 to the container 17 through the pipe 22a and the supply port 17a. Therefore, in the plasma processing apparatus 1, the focus ring FR can be raised by supplying the ionic liquid to the container 17.

Further, the plasma processing apparatus 1 is configured to retrieve the ionic liquid discharged from the container 17 to the supply unit 23 through the pipe 22b and the discharge port 17b. Therefore, in the plasma processing apparatus 1, the ionic liquid mixed with foreign matters such as particles and by-products generated by the etching process can be retrieved from the container 17.

Further, the supply unit 23 includes a filter 23b for filtering the ionic liquid in the path for circulating the ionic liquid. The supply unit 23 filters the retrieved ionic liquid through the filter 23b and supplies the filtered ionic liquid to the container 17 again. Therefore, in the plasma processing apparatus 1, the foreign matter mixed with the ionic liquid can be removed by the filter 23b, and the retrieved ionic liquid can be effectively reused.

The supply unit 23 may include a temperature control mechanism such as a heater. In this case, the temperature of the ionic liquid is controlled to a predetermined temperature by the temperature control mechanism, and the temperature-controlled ionic liquid may be circulated. Therefore, in the plasma processing apparatus 1, the temperature of the focus ring FR can be controlled by controlling the temperature of the ionic liquid.

Further, in the present embodiment, the supply unit 23 is arranged outside the processing chamber 10, and the ionic liquid is circulated between the supply unit 23 and the container 17 inside the processing chamber 10 through the pipes 22a and 22b. However, the supply unit 23 may be arranged inside the processing chamber 10. When the supply unit 23 is arranged inside the processing chamber 10, it is not necessary to consider a pressure difference between the inside and the outside of the processing chamber 10. However, in this plasma processing apparatus 1, it becomes necessary to open the processing chamber 10 when performing maintenance such as replenishment and retrieval of the ionic liquid to the tank 23a. In view of the above, the maintenance cycle can be lengthened by increasing the amount of the ionic liquid stored in the tank 23a.

On the other hand, by arranging the supply unit 23 outside the processing chamber 10 as in the present embodiment, the replenishment of the ionic liquid to the tank 23a and the retrieval of the ionic liquid can be performed without opening the processing chamber 10.

Figure 6:
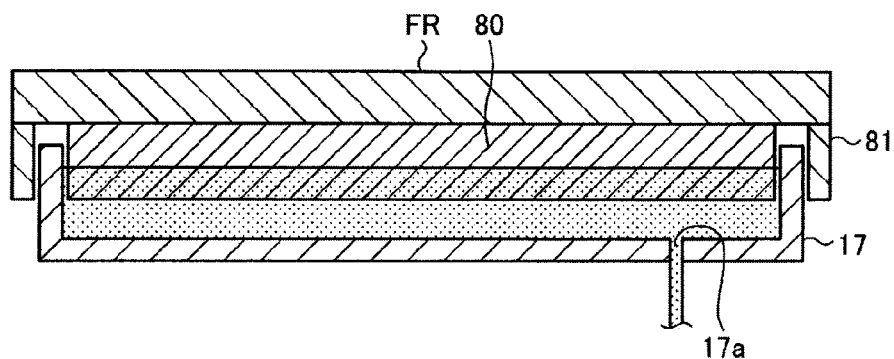
FIG. 6 is a cross-sectional view showing another example of the focus ring according to the embodiment.

Further, the focus ring FR may include a guard member disposed at a peripheral edge portion of the lower surface thereof to surround the side surface of the container 17. FIG. 6 is a cross-sectional view showing another example of the focus ring according to the embodiment. The focus ring FR has a guard member 81 disposed at the peripheral edge portion of the lower surface thereof to surround the side surface of the container 17. Thus, the ionic liquid in the container 17 is suppressed from being exposed to the plasma through the gap between the focus ring FR and the container 17 so that deterioration of the ionic liquid stored in the container 17 can be suppressed.

Figure 7A:
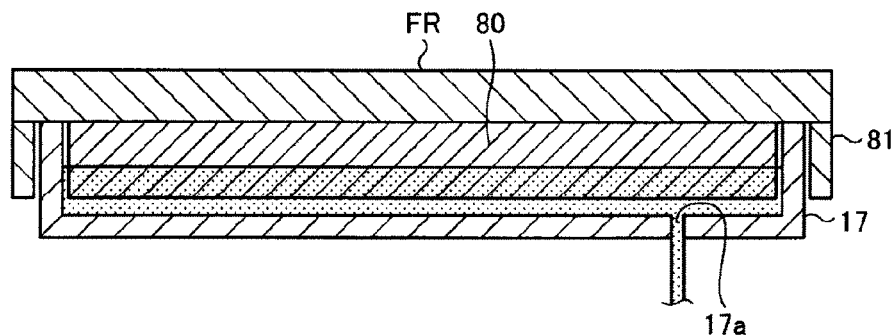
FIG. 7A is a cross-sectional view showing an example in which the focus ring according to the embodiment shown in FIG. 6 is lowered.
Figure 7B:
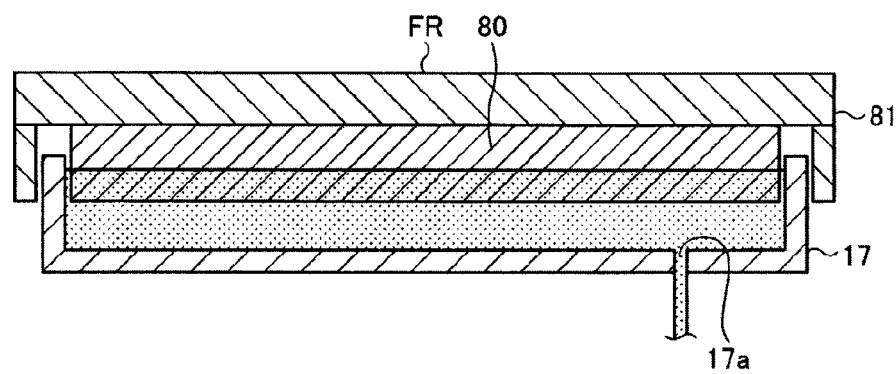
FIG. 7B is a cross-sectional view showing an example in which the focus ring according to the embodiment shown in FIG. 6 is raised.

The controller 100 is configured to control the supply unit 23 to supply or discharge the ionic liquid and lower or raise the focus ring FR by changing the amount of the ionic liquid stored in the container 17. FIG. 7A is a cross-sectional view showing an example in which the focus ring according to the embodiment shown in FIG. 6 is lowered. FIG. 7B is a cross-sectional view showing an example in which the focus ring according to the embodiment shown in FIG. 6 is raised. The ionic liquid also serves as a lubricant between the container 17 and the support base 80. Further, since the guard member 81 is provided, it may not be necessary to firmly seal the portion of the container 17 into which the ionic liquid is introduced.

As described above, the plasma processing apparatus 1 according to this embodiment includes the processing chamber 10, the focus ring FR, the supply unit 23 and the container 17. In the processing chamber 10, a semiconductor wafer W that is a target object is placed therein, and the substrate processing is performed. The focus ring FR is disposed in the processing chamber 10 and is consumed by the substrate processing. The supply unit 23 supplies the ionic liquid in response to the consumption of the focus ring FR. The container 17 serves as a drive unit that drives the focus ring FR by using the ionic liquid supplied from the supply unit 23. Therefore, the plasma processing apparatus 1 is capable of driving the focus ring FR with a simple configuration.

Further, the container 17 is configured to store the ionic liquid supplied from the supply unit 23, and the focus ring FR floats on the stored ionic liquid. The container 17 serves as the drive unit that drives the focus ring FR by using buoyancy force exerted by the ionic liquid. Therefore, the plasma processing apparatus 1 is capable of driving the focus ring FR with a simple configuration in which the ionic liquid is supplied from the supply unit 23 to the container 17. In addition, since the plasma processing apparatus 1 does not require an electric drive mechanism such as a motor to drive the focus ring FR, the risk of dust generation can be prevented.

Further, the supply unit 23 is arranged outside the processing chamber 10. Therefore, the plasma processing apparatus 1 is capable of replenishing the ionic liquid to the tank 23a and retrieving the ionic liquid without opening the processing chamber 10.

Further, the ionic liquid has hydrophobicity. This prevents the moisture absorption into the ionic liquid.

Further, the ionic liquid is insoluble in water and does not react with water. This also prevents the moisture absorption into the ionic liquid.

Further, the ionic liquid is at least one of methyltrioctylammonium thiosalicylate, trihexyl(tetradecyl)phosphonium bis(2-ethylhexyl) phosphate, methyl-trioctylammonium bis (trifluoromethylsulfonyl) imide, 1-Ethyl-3-methylimidazolium bis(trifluoromethylsulfonyl) imide, 1-Butyl-3-methylimidazolium bis(trifluoromethylsulfonyl) imide, 1-Hexyl-3-methylimidazolium bis(trifluoromethylsulfonyl) imide, or 1-Methyl-1-propylpyrrolidinium bis(trifluoromethylsulfonyl) amide. Therefore, the plasma processing apparatus 1 is capable of utilizing the ionic liquid for driving the focus ring FR.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

For example, in the above-described embodiment, the case where the target substrate is the semiconductor wafer has been described as an example. However, the present disclosure is not limited thereto, and the target substrate may be another substrate such as a glass substrate or the like.

In the above-described embodiment, the case where the substrate processing apparatus is the plasma processing apparatus 1 and the plasma etching is performed as the substrate processing has been described as an example. However, the present disclosure is not limited thereto, and the substrate processing apparatus may be any apparatus that performs substrate processing that consumes or deteriorates the parts in the processing chamber.

In the above-described embodiment, the focus ring has been described as an example of the consumable part. However, the present disclosure is not limited thereto, and any consumable part other than the focus ring may be applied. For example, in the plasma processing apparatus, a cover ring configured to protect the side portion of the focus ring may be disposed to surround the focus ring. For example, the cover ring may be driven with the ionic liquid in response to (following) the consumption thereof.

Further, in the above-described embodiment, the case where the container 17 serves as the drive unit and the focus ring FR is driven by using the buoyancy force exerted by the ionic liquid stored in the container 17 has been described as an example. However, the present disclosure is not limited thereto. A member that can drive the consumable part using the pressure of the ionic liquid supplied from the supply unit 23 may be used as the drive unit. For example, the drive unit may be a cylinder having a rod that is extensible and retractable based on the amount of the ionic liquid supplied from the supply unit.

Figure 8:
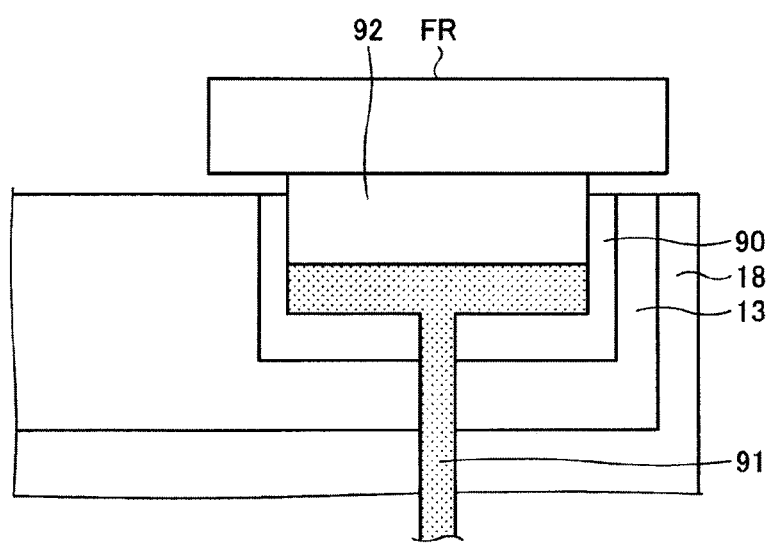
FIG. 8 is a cross-sectional view showing another example of a drive unit according to the embodiment.

FIG. 8 is a cross-sectional view showing another example of the drive unit according to the embodiment. A cylinder 90 is provided below the focus ring FR. The cylinder 90 is connected to the supply unit 23 through a pipe 91, and an ionic liquid is supplied through the pipe 91. The cylinder 90 has a rod 92 that is extended and retracted based on the amount of the supplied ionic liquid to drive the focus ring FR. In the plasma processing apparatus 1, three or more cylinders 90 may be arranged in a peripheral portion of an upper surface of the susceptor 13 in the circumferential direction to raise and lower the focus ring FR.

The invention claimed is:

1. A substrate processing apparatus comprising:
a processing chamber in which a target substrate is disposed and substrate processing is performed on the target substrate;
a consumable part disposed in the processing chamber and consumed by the substrate processing;
a supply unit configured to supply an ionic liquid in response to a consumption of the consumable part; and
a drive unit configured to drive the consumable part by using the ionic liquid supplied from the supply unit,
wherein the drive unit is a container configured to store the ionic liquid supplied from the supply unit and allow the consumable part to be floated on the ionic liquid stored therein, and the drive unit drives the consumable part by using buoyancy force exerted by the ionic liquid.

2. The substrate processing apparatus of claim 1, wherein the processing chamber is maintained in a vacuum atmosphere during the substrate processing, and the supply unit is disposed inside the processing chamber.

3. The substrate processing apparatus of claim 1, wherein the processing chamber is maintained in a vacuum atmosphere during the substrate processing, and the supply unit is disposed outside the processing chamber.

4. The substrate processing apparatus of claim 1, wherein the substrate processing is an etching process for etching the target substrate by generating plasma while supplying a processing gas into the processing chamber, and the consumable part is a focus ring disposed to surround the target substrate.

5. The substrate processing apparatus of claim 1, wherein the ionic liquid has hydrophobicity.

6. The substrate processing apparatus of claim 1, wherein the ionic liquid is insoluble in water and does not react with water.

7. The substrate processing apparatus of claim 1, wherein the ionic liquid is at least one of methyltrioctylammonium thiosalicylate, trihexyl(tetradecyl)phosphonium bis(2-ethylhexyl) phosphate, methyl-trioctylammonium bis (trifluoromethylsulfonyl) imide, 1-Ethyl-3-methylimidazolium bis (trifluoromethylsulfonyl) imide, 1-Butyl-3-methylimidazolium bis(trifluoromethylsulfonyl) imide, 1-Hexyl-3-methylimidazolium bis(trifluoromethylsulfonyl) imide, or 1-Methyl-1-propylpyrrolidinium bis(trifluoromethylsulfonyl) amide.

8. The substrate processing apparatus of claim 1, further comprising a support base configured to support the consumable part, the support base being disposed in the container.

9. The substrate processing apparatus of claim 1, further comprising a guard member disposed at a peripheral edge portion of a lower surface of the consumable part to surround a side surface of the container.

10. The substrate processing apparatus of claim 1, wherein a supply port and a discharge port are disposed at a bottom portion of the container.

* * * * *